United States Patent
Lefevre

(10) Patent No.: US 10,601,341 B2
(45) Date of Patent: Mar. 24, 2020

(54) NEUTRAL POINT CLAMPED MULTIPLE-LEVEL SWITCHING UNIT FOR VOLTAGE INVERTER OR RECTIFIER

(71) Applicant: Commissariat à l'Energie Atomique et aux Energies Alternatives, Paris (FR)

(72) Inventor: Guillaume Lefevre, Aix les Bains (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/184,953

(22) Filed: Nov. 8, 2018

(65) Prior Publication Data

US 2019/0149064 A1 May 16, 2019

(30) Foreign Application Priority Data

Nov. 10, 2017 (FR) ..................................... 17 60577

(51) Int. Cl.
| | |
|---|---|
| *H02M 7/48* | (2007.01) |
| *H02M 7/487* | (2007.01) |
| *H02M 7/537* | (2006.01) |
| *H02M 7/00* | (2006.01) |
| *H02M 7/483* | (2007.01) |

(52) U.S. Cl.
CPC ........... *H02M 7/487* (2013.01); *H02M 7/003* (2013.01); *H02M 7/537* (2013.01); *H02M 2007/4835* (2013.01)

(58) Field of Classification Search
CPC ...... H02M 7/487; H02M 7/003; H02M 7/537; H02M 2007/4835
See application file for complete search history.

(56) References Cited

U.S. PATENT DOCUMENTS

| | | | | |
|---|---|---|---|---|
| 5,459,655 | A * | 10/1995 | Mori ....................... | H01L 23/04 257/E23.14 |
| 9,281,760 | B2 * | 3/2016 | Kobayashi ............ | H02M 7/487 |
| 9,654,026 | B2 * | 5/2017 | Nakashima ........... | H02M 7/487 |
| 2010/0315776 | A1 * | 12/2010 | Ono ...................... | H02M 7/487 361/689 |
| 2014/0003103 | A1 * | 1/2014 | Aaltio .................... | H02M 1/32 363/56.03 |
| 2014/0111959 | A1 | 4/2014 | Li et al. | |

(Continued)

FOREIGN PATENT DOCUMENTS

| | | |
|---|---|---|
| EP | 0590502 A2 | 4/1994 |
| EP | 2677646 A2 | 6/2013 |

(Continued)

OTHER PUBLICATIONS

Preliminary Search Report for French Application No. 1760577 dated Jun. 27, 2018, 2 pages.

(Continued)

*Primary Examiner* — Fred E Finch, III
*Assistant Examiner* — Rafael O. De León Domenech
(74) *Attorney, Agent, or Firm* — Moreno IP Law LLC

(57) ABSTRACT

A neutral point clamped multiple-level switching unit is disclosed, including four series-connected switches, where the electric path in the four switches approximately follows a T shape, two of the switches located in the middle of the series association being arranged in the foot of the T.

10 Claims, 4 Drawing Sheets

(56) References Cited

U.S. PATENT DOCUMENTS

2014/0252410 A1 9/2014 Laschek-Enders
2014/0254228 A1* 9/2014 Ying .................. H02M 7/5387
363/132

FOREIGN PATENT DOCUMENTS

EP 2884650 A1 6/2015
EP 2996233 A1 3/2016

OTHER PUBLICATIONS

S. Li et al., "Reduction of Stray Inductance in Power Electronic Modules Using Basic Switching Cells," 2010 IEEE Energy Conversion Congress and Exposition, Sep. 2010, pp. 2686-2691.
C. Chen et al., "Investigation, Evaluation, and Optimization of Stray Inductance in Laminated Busbar," IEEE Trans. Power Electronics, vol. 29, No. 7, Jul. 2014, 15 pages.
L. Popova et al., "Stray inductance estimation with detailed model of the IGBT module," 2013 15th European Conference on Power Electronics and Applications (EPE), Oct. 2013, 8 pages.
S. Kicin et al, "A New Concept of a High-Current Power Module Allowing Paralleling of Many SiC Devices Assembled Exploiting Conventional Packaging Technologies," ISPSD 2016, pp. 467-470.
Z. Chen, "Characterization and Modeling of High-Switching-Speed Behavior of SiC Active Devices," Master of Science Thesis, Virginia Polytechnic Institute and State University, <accessible via the Internet at: https://vtechworks.lib.vt.edu/handle/10919/30778>, Dec. 18, 2009, 188 pages.
S. Tiwari et al., "Comparative Evaluation of a Commercially Available 1.2 kV SiC MOSFET Module and a 1.2 kV Si IGBT Module," <available via the Internet at: IECON 2016—42nd Annual Conference of the IEEE Industrial Electronics Society>, Oct. 2016, 6 pages.
Semikron International GmbH, prepared by I. Staudt, "Application Note AN-11001: 3L NPC & TNPC Topology," <accessible via the Internet at: https://studylib.net/doc/18123952/3l-npc-tnpc-topology>, Dec. 12, 2015, 12, pages.

* cited by examiner

NEUTRAL POINT CLAMPED MULTIPLE-LEVEL SWITCHING UNIT FOR VOLTAGE INVERTER OR RECTIFIER

CROSS-REFERENCE TO RELATED APPLICATION

This application claims the priority benefit of French patent application number 17/60577, the content of which is hereby incorporated by reference in its entirety to the maximum extent allowable by law.

FIELD

The present disclosure generally relates to electronic circuits and, more specifically, to voltage converters or inverters. The present disclosure more particularly relates to voltage converters or inverters using switching units based on semiconductor components and to the topology of assembly of such components.

BACKGROUND

Voltage converters or inverters are widely used in power electronics or electrical engineering, to transfer power into power converters. Many applications where one or a plurality of voltage inverters, performing a DC/AC conversion, are used in conversion systems having any general conversion function (DC/DC, AC/AC, DC/AC or AC/DC) are known.

A particularly widespread category of converters concerns neutral point clamped (NPC) inverters. Typically, a voltage inverter of this type is based on the use of switching units formed of power switches, generally MOS transistors or IGBT transistors, assembled with capacitive elements.

The different components and their assembly are selected according to the voltage level (several hundred volts, or even in the order of one thousand or of a few thousand volts).

Document EP 2884650 describes a power unit comprising two elements and a three-level power conversion device, based on the replication of this unit. Each unit comprises two MOS transistors series-connected at the level of the drain of one of them and of the source of the other. The units are formed separately to be arranged in 3D, a unit being stacked on the two other units.

Document EP 2996233 describes a semiconductor device comprising two switching circuits respectively on IGBTs and diodes.

Document EP 0590502 describes an inverter device for electric rolling stock.

SUMMARY

An embodiment overcomes all or part of the disadvantages of known switching units for a voltage converter or inverter.

An embodiment provides a solution particularly adapted to voltages in the range from several hundreds to a few thousand volts.

An embodiment provides a solution particularly capable of minimizing conduction losses in the switching unit.

Thus, an embodiment provides a neutral point clamped multiple-level switching unit, comprising four series-connected switches, wherein the electric path in the four switches approximately follows a T shape, two of the switches located in the middle of the series association being arranged in the foot of the T, each of said two switches being series-connected with a diode between a first output terminal and a second output terminal of the unit.

According to an embodiment, said two switches are arranged to, when they conduct a same current, mutually compensate their respective parasitic inductances.

According to an embodiment, a node between said two switches defines the first output terminal of the unit.

According to an embodiment:
the series association of the four switches is connected between two input terminals of the unit;
a node between a first switch and a second switch is coupled, by a first diode, to a second output terminal of the unit;
a node between a third switch and a fourth switch is coupled, by a second diode, to the second output terminal of the unit, said two switches being the second and third switches.

According to an embodiment, the first and second diodes are connected to separate nodes, interconnected to the second output terminal.

According to an embodiment, the unit is formed on at least a printed circuit wafer defining conductive areas for receiving components and contact transfer wires.

According to an embodiment, first surfaces of the switches and diodes are coplanar.

According to an embodiment, four conductive areas each support one of the switches.

According to an embodiment, the unit comprises two co-planar wafers respectively receiving at least the first and second switches and the third and fourth switches, each wafer comprising a conductive area defining one of the connection nodes of one of the diodes.

According to an embodiment, each switch is associated with a diode assembled in parallel.

According to an embodiment, the switches are semiconductor components, preferably MOS or IGBT transistors.

According to an embodiment, each diode assembled in parallel with a switch is the intrinsic diode of the transistor.

According to an embodiment, each switch is formed of a plurality of semiconductor chips electrically in parallel.

An embodiment provides a power converter comprising:
at least one switching unit; and
at least one capacitive dividing bridge.

According to an embodiment, the capacitive dividing bridge comprises two capacitive elements series-connected between the input terminals, a node between the two capacitive elements being coupled to the second output terminal.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
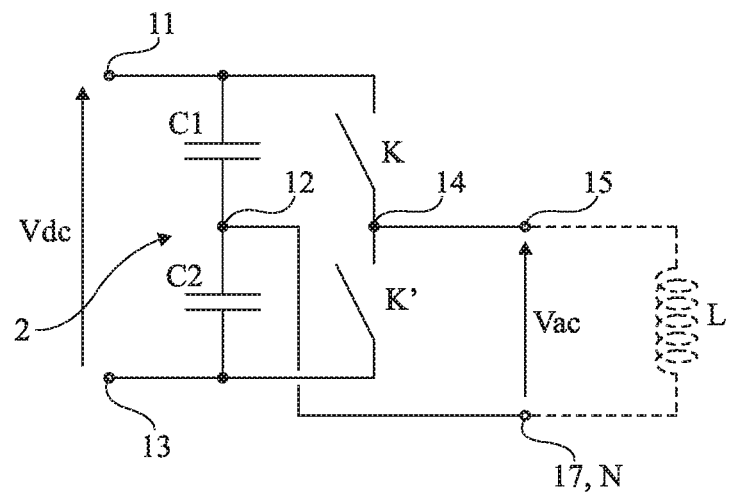
FIG. 1 very schematically shows the electric diagram of a usual example of a one-level switching unit, associated with a capacitive dividing bridge, for a converter or inverter.

The same elements have been designated with the same reference numerals in the different drawings.

For clarity, only those steps and elements which are useful to the understanding of the embodiments which will be described have been shown and will be detailed. In particular, the applications of the embodiments of the described switching units have not been detailed, the described embodiments being compatible with usual applications of such switching units whatever the conversion finally performed by the power conversion system. In particular, what has been described in relation with a voltage, inverter transposes to a voltage rectifier. Similarly, the control signals of the different switches are not detailed, the generation of these signals depends on the application and the structures provided in the present description are compatible with usual control circuits.

Throughout the present disclosure, the term "connected" is used to designate a direct electrical connection between circuit elements, whereas the term "coupled" is used to designate an electrical connection between circuit elements that may be direct, or may be via one or more intermediate elements. Unless indicated otherwise, when the term "coupled" is used, the connection can be implemented by a direct connection.

The terms "approximately", "about", and "in the order of" are used herein to designate a tolerance of plus or minus 10%, preferably of plus or minus 5%, of the value in question.

In the following description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., it is referred to the orientation of the drawings.

FIG. 1 very schematically shows the electric diagram of a usual example of a one-level switching unit associated with a capacitive dividing bridge, for a converter or inverter.

The switching unit comprises two input terminals 11 and 13 intended to receive a DC voltage Vdc and two output terminals 15 and 17 intended to supply an AC voltage Vac. The switching unit comprises two series-connected switches K and K', coupling (preferably connecting) terminals 11 and 13. Junction point 14 of switches K and K' defines terminal 15.

Two series-connected capacitive elements C1 and C2, forming a capacitive divider 2, couple (preferably connect) terminals 11 and 13. Midpoint 12 of the capacitive divider (between capacitive elements C1 and C2) defines the midpoint of the inverter and, in the example of FIG. 1, the neutral point N of AC voltage Vac. Generally, terminal 15 is connected to an inductive load L shown in dotted lines in FIG. 1 (for example, the winding of a motor or the filtering inductance of a load or of another conversion stage).

The operation of a converter such as shown in FIG. 1 is known. The AC voltage is generated by sequentially controlling switches K and K' according to a sequence of successive phases where the two switches K and K' are off, only switch K is on, the two switches K and K' are off, only switch K' is on, and so on. Each capacitive element C1, C2 sees, between its terminals, a voltage having a value corresponding to half the value of voltage Vdc. Output voltage Vac then oscillates between −Vdc/2 and Vdc/2. To simplify the disclosure of FIG. 1, the different parasitic elements (such as in particular the parasitic inductances of the conductors coupling the capacitive elements to the switches), although they play a role in the operation, have not been shown.

In practice, the switches are formed by semiconductor components, typically power MOS transistors or IGBT transistors. Due to the voltage levels involved, which may range up to several thousand volts, conduction losses and switching losses in transistors may become non-negligible. To decrease such losses, so-called multiple-level structures enabling to decrease the voltage across the switches are frequently used, to use switches having a lower breakdown voltage and thus decrease general losses.

Figure 2:
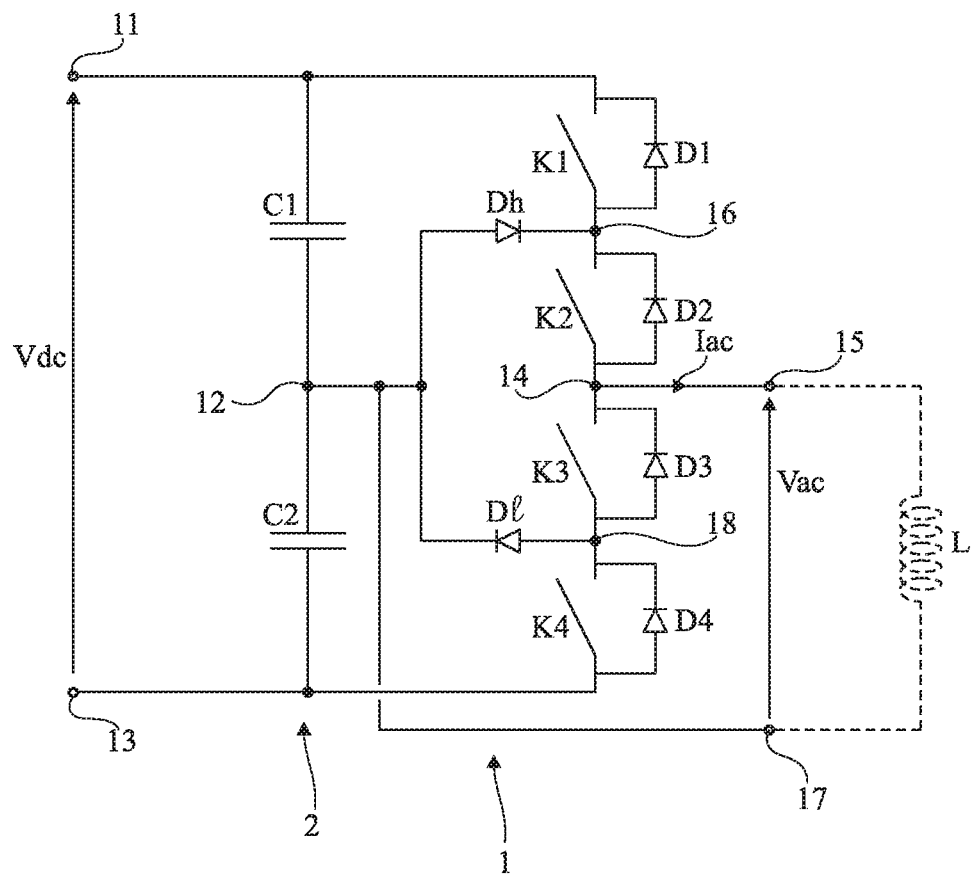
FIG. 2 very schematically shows the electric diagram of an example of a multiple-level switching unit associated with a capacitive divider for a neutral point clamped (NPC) converter.

FIG. 2 very schematically shows the electric diagram of an example of a multiple-level switching unit 1 associated with a capacitive divider 2 for a neutral point clamped (NPC) converter.

As in FIG. 1, capacitive divider 2 comprises two capacitive elements C1 and C2 series-connected between two input terminals 11 and 13 of the switching unit.

Switching unit 1 is formed of four switches K1, K2, K3 and K4, series-connected between the two input terminals 11 and 13 intended to receive a DC voltage Vdc to be converted. The switches are associated two by two, each pair forming a half stage, respectively high or low, of the series association. Junction point 14 between the two half stages defines the first output terminal 15 for supplying an AC voltage Vac, the second terminal 17 of voltage Vac being the neutral connected, in this example, to node 12. Each pair of switches is associated with a diode Dh, respectively Dl, having an electrode (the cathode for diode Dh and the anode for diode Dl) connected to junction point 16, respectively 18, of the two switches K1, K2, respectively K3, K4, of the half stage. The other electrode of diodes Dh and Dl (the anode for diode Dh and the cathode for diode Dl) is coupled (preferably connected) to junction point 12 of the series association of capacitive elements C1 and C2 of capacitive divider 2. Finally, each switch K1, K2, K3, K4 is provided with a diode D1, D2, D3, D4 in antiparallel forming a series association of diodes between terminals 11 and 13, all the anodes being directed towards terminal 13. Diodes D1 to D4 are in practice formed of the intrinsic diodes of the transistors, preferably, in this case, of the MOS transistors, forming switches K1 to K4.

Most often, the load connected to terminal 15 (between terminals 15 and 17) is, at least partially, inductive (inductance L shown in dotted lines) and capacitive. With an appropriate control of switches K1 to K4, voltage Vac is then sinusoidal. Switches K1 to K4 are typically controlled in pulse-width modulation according, among others, to the desired frequency of the AC voltage and to the quantity of power to be transferred to the load. The frequency of the control pulses is generally greater by a ratio of at least ten than the frequency of AC voltage Vac.

The operation of an inverter such as illustrated in FIG. 2 requires more switching phases than that of FIG. 1, but particularly decreases losses since, for a given DC voltage, it requires transistors with a lower breakdown voltage (blocked state), thus generating less on-state resistive losses, and which thus have a better switching performance. The output voltage of the unit, in the case of FIG. 2 takes, according to the switching phase (without considering the transformation to an AC waveform due to the load), the values of Vdc, Vdc/2, 0, Vdc/2, and Vdc.

The switching phases depend on the positive or negative signs of the output voltage or current. Since the load is at least partially inductive, voltage Vac and current Iac are generally not in phase. By convention, current Iac is considered to be positive when it comes out of terminal 15 towards the load.

The switching loops in switching unit 1 are conditioned by the control of switches K1 to K4, which depends on the sign of voltage Vac with respect to node 12-17 and on the direction of current Iac.

When voltage Vac and current Iac are positive (phase I), switch K2 is controlled to be turned on. Switch K4 is turned off. Switch K3 is controlled complementarily to switch K1. Current Iac flows:
When switch K1 is on, from terminal 11, through switches K1 and K2, to terminal 15; and
When switch K1 is off, from terminal 12, through diode Dh and switch K2.

When voltage Vac and current Iac are negative (phase III), switch K3 is controlled to be turned on. Switch K1 is turned off. Switch K2 is controlled complementarily to switch K4. Current Iac flows:
When switch K4 is on, from terminal 15 through switches K3 and K4, to terminal 13; and
When switch K4 is off, from terminal 15, through switch K3 and diode Dl.

When voltage Vac is positive and current Iac is negative (phase II), switch K2 is controlled to be turned on. Switch K4 is turned off. Switch K1 is controlled complementarily to switch K3. Current Iac flows:
When switch K3 is off, from terminal 15 through diodes D1 and D2, to terminal 11; and
When switch K3 is on, from terminal 15, through switch K3 and diode D1.

When voltage Vac is negative and current Iac is positive (phase IV), switch K3 is controlled to be turned on. Switch K1 is turned off. Switch K4 is controlled complementarily to switch K2. Current Iac flows:
When switch K2 is off, from terminal 13 through diodes D3 and D4, to terminal 15; and
When switch K2 is on, from terminal 12, through diode Dh and switch K2.

A disadvantage of usual structures of switching units with a capacitive midpoint is that the current flow loops are not symmetrical (of same length) in all phases. Phases I and III, which only involve two semiconductor components for the switching (respectively switch K1 and diode Dh, and switch K4 and diode Dl) are generally called short loops and phases II and IV, which involve four semiconductor components (respectively switch K3 and diodes D1, D2, Dl, and switch K2 and diodes D3, D4, Dh) are called long loops.

Such a loop length difference generates non-negligible differences in the inductive paths. It is not unusual to find switching units where the inductive paths generate parasitic inductances in the order of some twenty nanohenries or even more for short current loops and in the order of some thirty nanohenries for long current loops. The difference is then in the order of fifty percent between long loops and short loops. This imposes sizing the unit according to the worst case, that is, to the worst inductive path and taking it into account in the programming of the switching operations. This generally results in a slower switching frequency of the switches, and in higher losses.

Symmetrical structures with a capacitive midpoint and a clamped neutral point respecting a three-level operation (Vdc, Vdc/2, 0) have already been provided. However, such structures, known as T-type neutral point clamped (T-NPC) require sizing two of the four switches so that they withstand the entire amplitude of voltage Vdc, which brings back disadvantages of the two-level structure of FIG. 1.

All these difficulties are increased by the fact that, although, from the point of view of the electric diagram on paper, an assembly may be symmetrical, this is not the case during the industrial manufacturing of this assembly in the form of chips of semiconductor components assembled on a substrate or wafer and connected by conductive tracks or by conductive wires.

The above embodiments originate from a new analysis of the operation of a three-level NPC switching unit to symmetrize the electric paths of the different switching phases while keeping components which only need to withstand half the amplitude of the DC input voltage.

Figure 3:
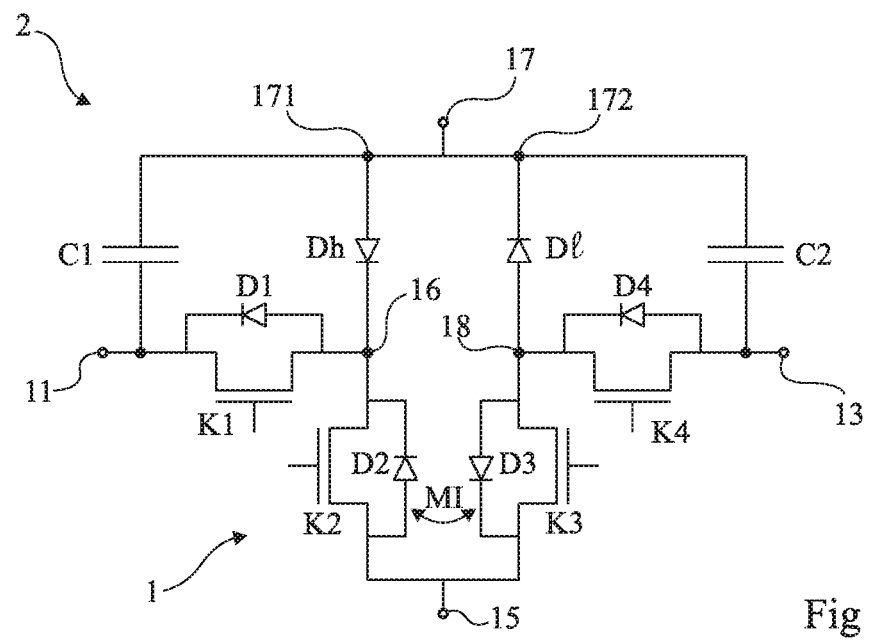
FIG. 3 shows the electric diagram of an embodiment of a neutral point clamped switching unit associated with a capacitive dividing bridge.

FIG. 3 shows an electric diagram of an embodiment of a neutral point clamped switching unit 1 associated with a capacitive dividing bridge 2.

It comprises the same components as in the assembly of FIG. 2, that is:
Two capacitive elements C1 and C2 series-connected between terminals 11 and 13 of application of a DC voltage;
Two controllable switches K1 and K2, here MOS transistors, series-connected between terminal 11 and a first AC power supply terminal 15, their junction point 16 being coupled, by a diode Dh (cathode on the side of node 16), to a second AC voltage supply terminal 17 (neutral), also coupled to junction point 12 of capacitive elements C1 and C2;
Two controllable switches K3 and K4, series-connected between terminals 15 and 13, their junction point 18 being coupled by a diode Dl (anode on the side of node 18) to terminal 17; and
Four diodes D1, D2, D3, and D4 series-connected between terminals 11 and 13, the anodes being all directed towards terminal 13 and diodes D1 to D4 being preferably the intrinsic diodes of transistors K1 to K4.

However, from the electric pattern or path viewpoint, it is provided to arrange the different components to balance the inductive paths between long loops and short loops. It could have been devised to lengthen the paths of short loops to have them correspond to those of long loops. However, this would not change the conventional situation since this would amount to a worst case sizing. Thus, in the above embodiments, it is not only provided to decrease the inductive path of short loops, but also to decrease the resultants of the inductance values of the paths of the long loops to bring them closer to those of short loops.

During phase I, the current loop includes switch K1 and diode Dh.

During phase II, the current loop includes switches K1, K2, K3, and diode Dl.

During phase III, the current loop includes diode Dl and switch K4.

During phase IV, the current loop includes diode Dh and switches K2, K3, and K4.

The representation of FIG. 3 shows a specific layout of the assembly of semiconductor components on a substrate or on a printed circuit board. Indeed, switches K2 and K3 are arranged next to each other and with currents which cross them having opposite directions. Thus, the inductance which is introduced by each component K2 and K3 is compensated by that of the other one due to mutual inductance MI between the two paths which are close to each other and where the currents are in reverse directions. Accordingly, from the viewpoint of the inductive path, switches K2 and K3, which partially compensate each other, may be not taken into account, and it may be considered that the number of components is the same in long loops and in short loops. The structure then becomes symmetrical, while keeping the advantage of decreased losses due to the fact that the different components see at most half of voltage Vdc. Thus, during the assembly of the switches in a unit, it is provided for the electric path in the four switches to approximately follow a T shape, two of the switches located in the middle of the series association being arranged in the foot of the T. These two switches are arranged to, when they are crossed by a same current, mutually compensate their respective parasitic inductances.

Such a T association on a substrate or on a printed circuit results in an arrangement of the components on a same plane. Such a planar arrangement, where the switches of the switching unit are coplanar (first surfaces of the switches and diodes are coplanar) takes part in the balance of the current loops between the different switching phases.

Preferably, it is provided to physically dissociate a node 171 of connection of the anode of diode Dh to capacitive element C1 from a node 172 of connection of the cathode of diode Dl to capacitive element C2. This new structure enables to separate at best the current loops from one another and, as will be seen hereafter, eases the industrial manufacturing with approximately symmetrical paths.

The forming of a switching unit based on semiconductor components generally uses vertical power components, that is, semiconductor chips having a back side comprising a metal plane intended to be directly assembled on a conductive surface of a substrate or wafer of the unit, and having a front side comprising one (for a diode) or two (for a switch) metallizations to receive, by welding, one or a plurality of conductive wires for transferring the contact towards a conductive area of the substrate or wafer.

The embodiments described hereafter aim at this type of embodiments.

Figure 4:
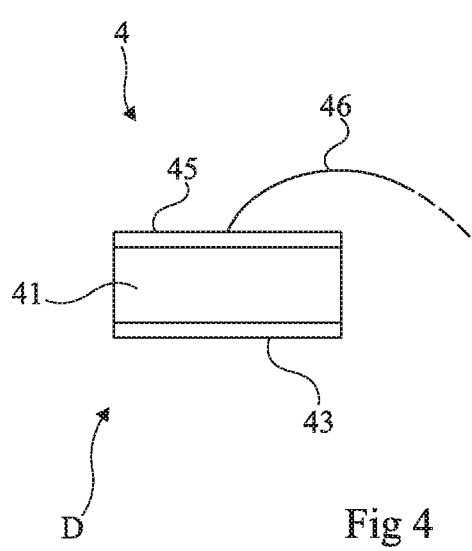
FIG. 4 is a very simplified cross-section view of a chip made of semiconductor material, forming a diode.

FIG. 4 is a very simplified cross-section view of a chip 4 made of semiconductor material, forming a diode D.

Diode D is formed, for example, in an N-type substrate 41. A back side metallization 43 defines the cathode of the diode. A P-type region is formed on the front side and is contacted by a metallization 45 defining the anode. Chip 4 is intended to be assembled by its back side on a conductive area of a wafer (not shown in FIG. 4) supporting the switching unit. Anode 45 is intended to be transferred onto a conductive area of the wafer or on the front side of another component by one or a plurality of conductive wires 46.

Figure 5:
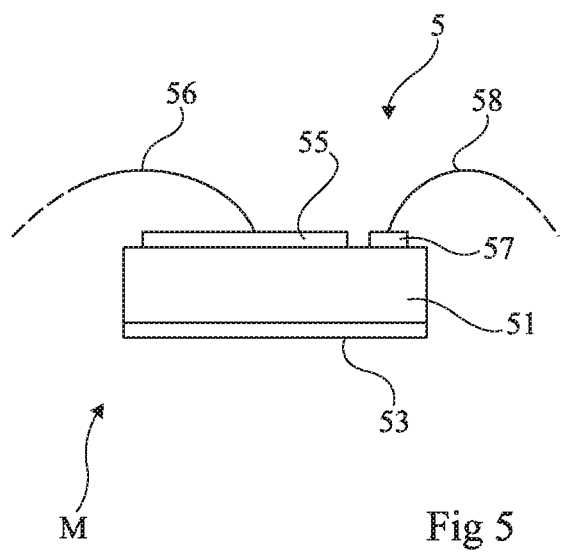
FIG. 5 is a very simplified view of a chip made of a semiconductor material, forming a vertical MOS transistor.

FIG. 5 is a very simplified cross-section view of a chip 5 of semiconductor material, forming a vertical MOS transistor M.

The forming of a P-channel transistor in an N-type substrate 51 having its drain defined by the back side (metallization 53) is assumed. The source contacts are transferred to the front side by one or a plurality of metallizations 55 and the gate is also accessible via a metallization 57. Chip 5 is intended to be assembled by its back side (drain) onto a conductive area of a wafer (not shown in FIG. 5) supporting the switching unit. Source 55 and gate 57 are intended to be transferred onto a conductive area of the wafer or onto the front surface of another component by one or a plurality of conductive wires, respectively 56 and 58.

To form a power unit, a plurality of chips 4 and 5 may be used to form each diode D and each switch M by assembling and connecting these chips in parallel, according to the required power. Similarly, capacitive elements C1 and C2 may be formed of one or a plurality of capacitors connected in parallel.

Figure 6:
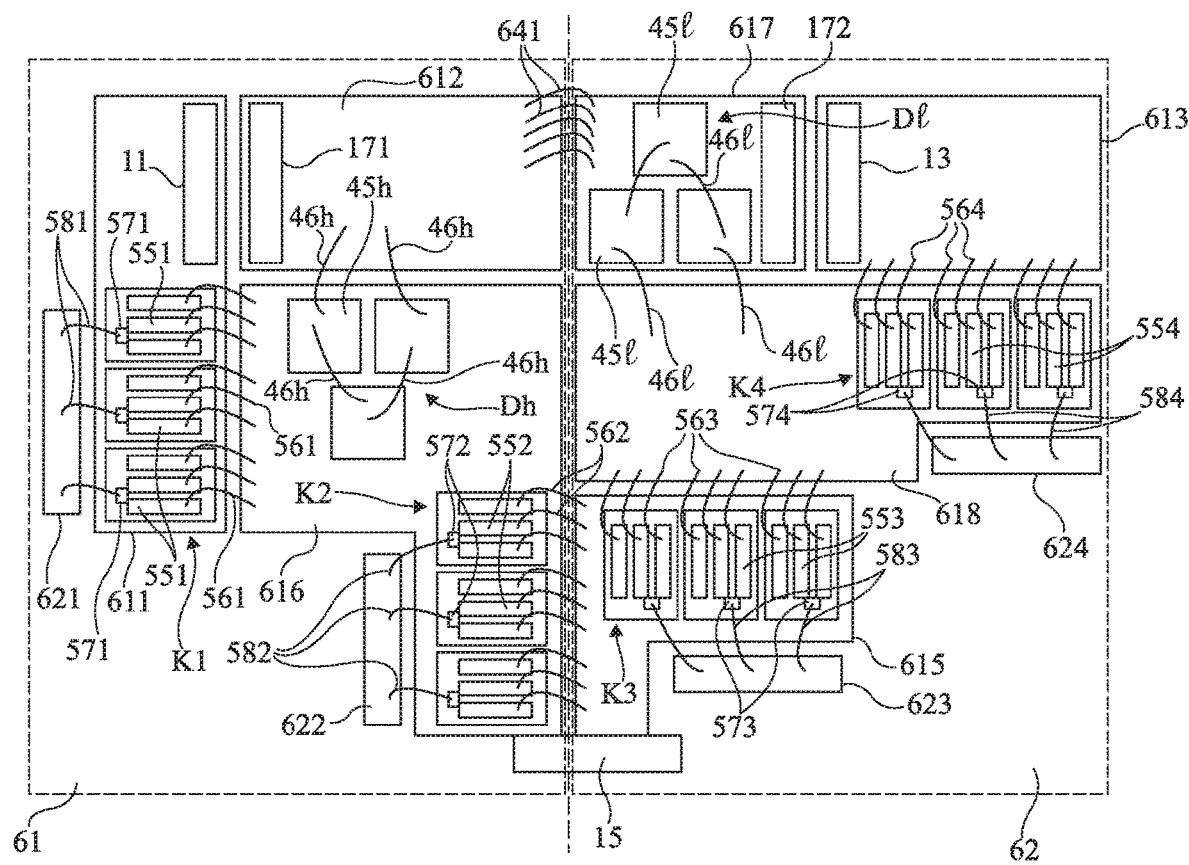
FIG. 6 is a top view of an embodiment of a switching unit according to the diagram of FIG. 3.

FIG. 6 is a top view of an embodiment of a switching unit according to the diagram of FIG. 3.

The assembly is formed on two wafers 61 and 62 separate from each other. Each wafer is for example formed on an insulated metal substrate or a printed circuit board (PCB) and comprises areas and conductive surfaces which are, that is, insulated from one another.

In the example of FIG. 6, the forming of a unit where each switch is formed of three MOS transistor chips 5 (FIG. 5) and each diode Dh, Dl is formed of three chips 4 (FIG. 4) is assumed. It is also assumed that diodes D1, D2, D3, and D4 are formed of the intrinsic diodes of transistors K1, K2, K3, and K4.

Each wafer 61, 62 supports half of the assembly of FIG. 3, that is, respectively components Dh, K1, K2, and components Dl, K3, K4. The components are distributed according to the T layout of FIG. 3 while taking into account bulk constraints. The separation between wafers represents the separation between nodes 171 and 172 to force the flowing of current in the portion of the assembly defining transistors K2 and K3 and to take advantage of the mutual inductance effect.

It is provided to define, in each wafer 61, 62 a plurality of printed circuit conductive areas to support the back side contacts of the components, receive the front side contact transfer wires, as well as input and output areas. The components, and particularly transistors K1 and K2, are preferably all supported by the same surface of the wafers which are coplanarly arranged. This takes part in uniformizing the length of the current loops.

On the side of wafer 61, five conductive areas are provided in this example. An area 621, for example, of vertically oriented rectangular general shape, located leftmost, defines a terminal of the assembly for receiving the gate control signal of transistor K1. To the right of area 621, an area 611, for example, of vertically oriented rectangular general shape, receives the back sides of the chips forming transistors K1, and thus terminal 11. To the right of the lower portion of area 611 is located an area 616, for example, having a general upside-down L shape, having its base (at the top) supporting the chips forming diode Dh by their cathode back sides, and thus node 16. The vertical branch of the L of area 616 is directed downwards (respecting the shape of the assembly of FIG. 3) and receives the back sides (drains) of the chips forming transistor K2. To the right of the upper portion of area 611 is located an area 612, for example, having a horizontally oriented rectangular general shape (along the base of the L of area 616). Area 612 defines a first terminal 171 of neutral 17 (or node 12). To the left of the branch of the L of area 616 is located an area 622, for example, of vertically oriented rectangular general shape, defining a terminal for receiving the gate control signal of transistor K2. The transfers of the front side contacts of the different chips onto the conductive areas are performed by (heat or cold) welded or soldered conductive wires. Thus, wires 581 connect gate contacts 571 of the chips defining transistor K1 to area 621. Wires 561 connect source contacts 551 of the chips defining transistor K1 to area 616. Wires 582 connect gates contacts 572 of the chips defining transistor K2 to area 622. Wires 46h connect anode contacts 45h of the chips defining diode Dh to area 612.

On the side of wafer 62, six conductive areas are provided in this example. An area 617, for example, having a square or horizontally oriented rectangular general shape, is located opposite area 612 of wafer 61. Area 617 defines a second terminal 172 of neutral 17 (neutral 12) and receives the chips forming diode Dl by their cathode back sides. Wires 641 couple areas 612 and 617. To the right of area 617, an area 613, for example, of square or horizontally oriented rectangular general shape, defines terminal 13. Under areas 617 and 613, an area 618, for example, or horizontally oriented rectangular general shape, receives in its right-hand portion the back side of the chips forming transistors K4, and thus node 18. An area 615, for example, having a general rectangular or L shape located under the left-hand portion of area 618 and opposite the branch of area 616 receiving transistor K1. This area 615 receives the back sides of the chips forming transistors K3, and thus terminal 15. An area 623, for example having a horizontally oriented rectangular general shape, defines under area 615 a terminal of the assembly for receiving the gate control signal of transistor K3. Finally, an area 624, for example having a horizontally oriented rectangular general shape, defines under the (free) right-hand portion of area 618 a terminal of the assembly for receiving the gate control signal of transistor K4. Wires 583 connect the gate contacts 573 of the chips defining transistor K3 to area 623. Wires 564 connect the source contacts 554 of the chips defining transistor K4 to area 613. Wires 584 connect the gate contacts 574 of the chips defining transistor K4 to area 624. Wires 461 connect the anode contacts 451 of the chips defining diode Dl to area 617. Finally wires 562 connect source contacts 552 of the chips defining transistor K2 to area 615. Terminal 15 is, in this example, taken on area 615.

A structure such as illustrated in FIG. 6 respects the diagram of FIG. 3 by separating the neutral nodes of the left-hand and right-hand portions of the structure, to optimize the symmetry of the inductive paths.

Figure 7:
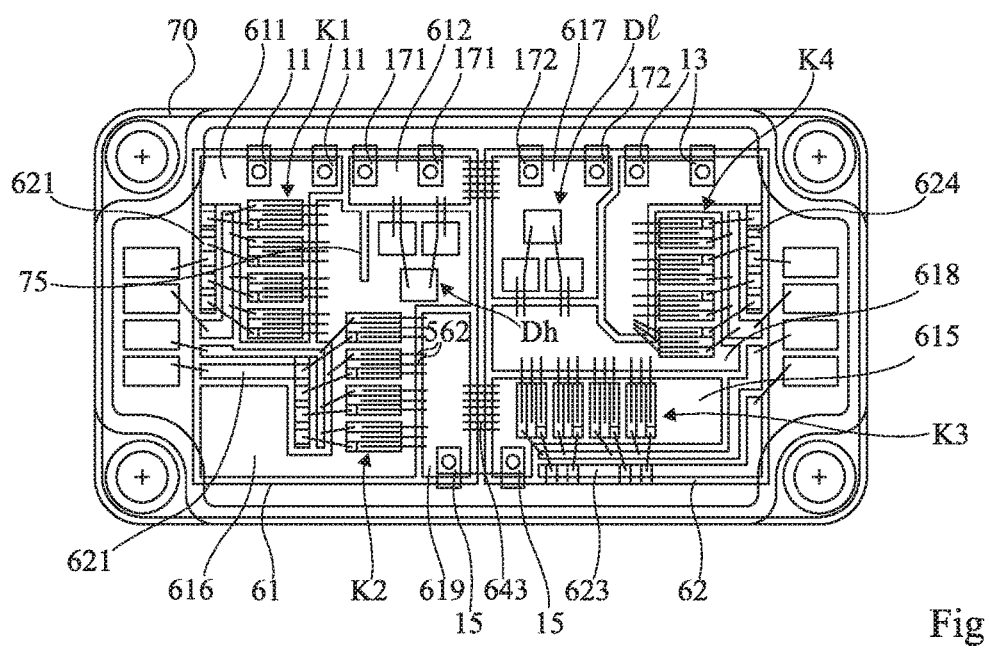
FIG. 7 is a top view of another embodiment of a switching unit of the type illustrated in FIG. 6.

FIG. 7 is a top view of an embodiment of a switching unit of the type of that illustrated in FIG. 6.

The assembly is assumed to be mounted in a package 70. The different conductive areas of wafer 61 and 62 are defined to be contained within rectangular or square wafers. Thus, the shapes given as an example in FIG. 6 are not respected. However, these shapes are drawn and arranged to respect approximately symmetrical inductive paths in the different loops. For example, as compared with FIG. 6, four chips are provided to form each switch. Further, the chips forming transistor K4 are arranged vertically instead of horizontally as in FIG. 6. In practice, terminal blocks for connecting the switching unit to the capacitive bridge and to the load are provided at the periphery of the unit. Thus, areas 621 and 623 in particular are continued by a pattern all the way to terminal blocks respectively to the left and to the right of the unit. Further, an additional area 619 for receiving wires 562 for recovering the sources of the chips forming transistor K2 is provided on the side of wafer 61. Area 619 is coupled by wires 643 to area 615 of wafer 62. An advantage is that this eases the manufacturing of the left-hand and right-hand portions of the unit separately, the connection of the two neutral nodes 171 and 172 and the connection on the side of terminal 15 being performed subsequently.

It may be provided for one or a plurality of conductive areas to have a slot (for example, vertical slot 75 in area 616) to orient the current flow or to force a certain path. This enables to further optimize the symmetry of the inductive paths.

Preferably, the chips having front surface contacts which should be transferred onto a neighboring conductive area are oriented so that the connection or bonding wires all have approximately a same length for given chips of the same component. This enables not to introduce a new imbalance in the length of the conductive paths.

A unit such as shown in FIG. 7 may be formed with inductance values of inductive paths in the order of some ten nanohenries and with an inductance value difference between the inductive paths of less than 20 percent, or even in the order of 10 percent, of the average value of the inductance of the inductive paths. Thus, not only does the provided layout enable to decrease the inductance value of the inductive paths of the different loops by a factor in the order of 2 or 3 with respect to usual layouts, but also, particularly due to the layout of switches K2 and K3, the inductance difference between long and short loops is considerably decreased.

Figure 8:
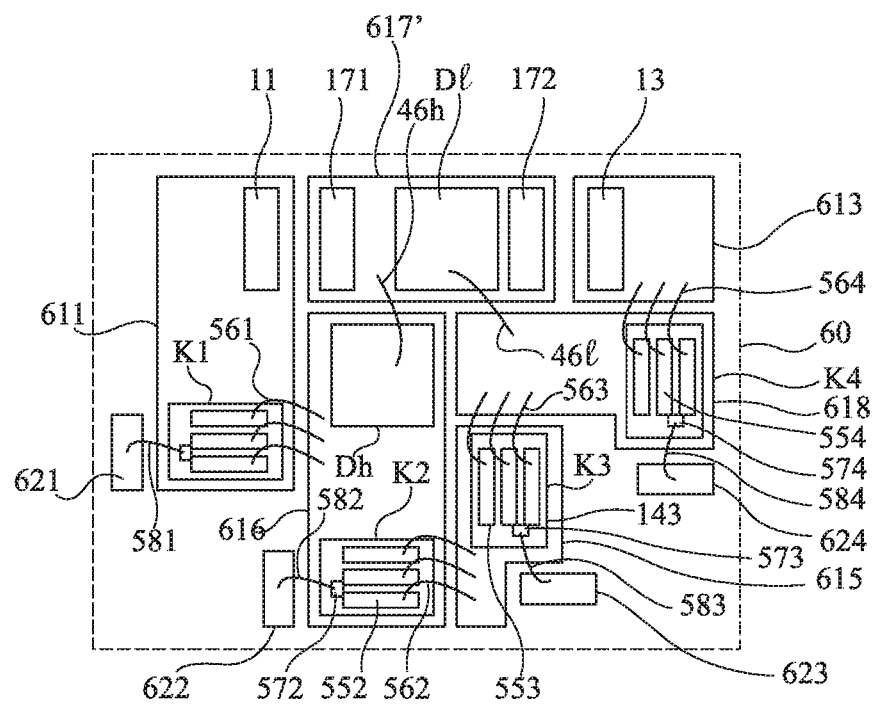
FIG. 8 is a top view of still another embodiment of a switching unit according to the diagram of FIG. 3.

FIG. 8 is a top view of still another embodiment of a switching unit according to the diagram of FIG. 3.

This embodiment is simplified in that it provides a single chip per component. Further, the unit is formed on a single printed circuit board. A consequence is that a single area 617' defines neutral node 17.

An advantage of the described embodiments is that they combine the possibility of using semiconductor components sized for a voltage smaller than the voltage of a two-level converter (FIG. 1) while allowing a balancing of the inductive paths in the different current flow loops.

A multiple-level switching unit is not necessarily used alone. For example, to form a sinusoidal voltage inverter Vac, a plurality of these units, in a number depending on the number of phases of the generated AC voltage (two for a one-phase voltage, three for a three-phase voltage), are used.

Various embodiments have been described. Various alterations, modifications and improvements will occur to those skilled in the art. In particular, the sizing of the semiconductor components depends on the application and particularly on the involved voltages. Further, the number of components in parallel to form each semiconductor component also depends on the application and more specifically on the power of the unit and on the current that it should withstand. Further, the rectifier operation can be deduced from the inverter operation and all that has been described easily transposes to a voltage rectifier. Finally, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A neutral point clamped multiple-level switching unit comprising four series-connected switches (K1, K2, K3, K4), wherein an electric path in the four series-connected switches approximately follows a T shape, two (K2, K3) of the switches located in the middle of the series-connected switches being arranged in a foot of the T shape, each of said two switches (K2, K3) is series-connected with a first and a second diode (Dh, Dl) respectively, between a first output terminal (15) and a second output terminal (17) of the neutral point clamped multiple-level switching unit, the unit being formed on at least one printed circuit wafer (60, 61, 62) defining conductive areas for receiving components and contact transfer wires, the at least one printed circuit wafer comprising two coplanar wafers (61, 62) respectively receiving at least the first and second switches (K1, K2) and the third and fourth switches (K3, K4), each of the two coplanar wafers comprising a conductive area (612, 617) defining one of the separate nodes (171, 172) of the connection of one of the first and second diodes (Dh, Dl);

wherein a node between said two switches defines the first output terminal (15) of the neutral point clamped multiple-level switching unit, and wherein:

the four series-connected switches are connected between two input terminals (11, 13) of the unit;

a node (16) between a first switch (K1) and a second switch (K2) is coupled, by the first diode (Dh), to the second output terminal (17) of the neutral point clamped multiple-level switching unit;

a node (18) between a third switch (K3) and a fourth switch (K4) is coupled, by the second diode (Dl), to the second output terminal (17) of the unit, said two switches being the second and third switches; and the first and second diodes (Dh, Dl) are connected to the separate nodes (171, 172) that are interconnected to the second output terminal (17).

2. The unit of claim 1, wherein said two switches (K2, K3) are arranged to, when said two switches conduct a same current, mutually compensate (MI) respective parasitic inductances of said two switches.

3. The unit of claim 1, wherein first surfaces of the series-connected switches (K1, K2, K3, K4) and the first and second diodes (Dh, Dl) are coplanar.

4. The unit of claim 3, wherein four conductive areas (611, 616, 615, 618) each support one of the series-connected switches (K1, K2, K3, K4).

5. The unit of claim 1, wherein each of the series-connected switches (K1, K2, K3, K4) is respectively associated with a diode (D1, D2, D3, D4) assembled in parallel.

6. The unit of claim 1, wherein the series-connected switches (K1, K2, K3, K4) are semiconductor components, preferably MOS or IGBT transistors.

7. The unit of claim 5, wherein each diode (D1, D2, D3, D4) assembled in parallel with one of the series-connected switches (K1, K2, K3, K4) is an intrinsic diode of die series-connected switch.

8. The unit of claim 1, wherein each of the series-connected switches (K1, K2, K3, K4) is formed of a plurality of semiconductor chips electrically in parallel.

9. A power converter comprising:

at least one neutral point clamped multiple-level switching unit (1) of claim 1; and at least one capacitive dividing bridge (C1, C2).

10. The converter of claim 9, wherein the capacitive dividing bridge comprises two capacitive elements (C1, C2) series-connected between input terminals (11, 13), a node (12) between the two capacitive elements being coupled to the second, output terminal (17).

* * * * *